(12) United States Patent
Kim et al.

(10) Patent No.: US 12,074,040 B2
(45) Date of Patent: Aug. 27, 2024

(54) APPARATUS FOR TREATING SUBSTRATE USING LIQUID AND METHOD FOR CONTROLLING LIQUID

(71) Applicant: SEMES CO., LTD., Cheonan-si (KR)

(72) Inventors: Ji Ho Kim, Cheonan-si (KR); Jong Han Kim, Sejong-si (KR); Ju Dong Lee, Cheonan-si (KR); Ju Hwan Lee, Hwaseong-si (KR); Hyeon Jun Lee, Cheonan-si (KR)

(73) Assignee: Semes Co., Ltd., Chungcheongnam-do (KR)

(*) Notice: Subject to any disclaimer, the term of this patent is extended or adjusted under 35 U.S.C. 154(b) by 272 days.

(21) Appl. No.: 17/829,678

(22) Filed: Jun. 1, 2022

(65) Prior Publication Data
US 2022/0392784 A1  Dec. 8, 2022

(30) Foreign Application Priority Data
Jun. 3, 2021 (KR) .................. 10-2021-0072353

(51) Int. Cl.
*B05B 11/02* (2023.01)
*B05C 5/02* (2006.01)
(Continued)

(52) U.S. Cl.
CPC ........ *H01L 21/67051* (2013.01); *B05B 11/02* (2013.01); *B05C 5/02* (2013.01);
(Continued)

(58) Field of Classification Search
None
See application file for complete search history.

(56) References Cited

U.S. PATENT DOCUMENTS
7,918,182 B2  4/2011  Yamamoto et al.

FOREIGN PATENT DOCUMENTS
JP  H03223579 A  10/1991
JP  H11082763 A  3/1999
(Continued)

OTHER PUBLICATIONS

Korean Office Action dated Oct. 17, 2022 issued in corresponding Korean Appln. No. 10-2021-0072353.
(Continued)

*Primary Examiner* — Levon J Shahinian
(74) *Attorney, Agent, or Firm* — Harness, Dickey & Pierce, P.L.C.

(57) ABSTRACT

The inventive concept provides a liquid treating apparatus. The liquid treating apparatus includes a spin chuck configured to support and rotate a substrate; and a liquid supply unit configured to supply a liquid to the substrate, and wherein the liquid supply unit includes: a first nozzle connected to a first flow path pipe and configured to discharge a first liquid to the substrate; a first valve assembly including a first cut-off valve for cutting-off a flow of the first liquid within the first flow path pipe and a first suck-back valve for sucking-back the first liquid, and installed at the first flow pipe; a second nozzle connected to a second flow path pipe and configured to discharge a second liquid to the substrate; a second valve assembly including a second cut-off valve for cutting-off a flow of the second liquid within the second flow path pipe and a second suck-back valve for sucking-back the second liquid, and installed at the second flow pipe path; a first flow velocity controller configured to adjust an air flow velocity of an air introduced into or outflowed from the first suck-back valve; and a second flow velocity controller configured to adjust an air flow velocity of an air introduced into or outflowed from the
(Continued)

second suck-back valve, and wherein a first speed of a suck-back speed provided by the first valve assembly is slower than a second suck-back speed provided by the second valve assembly, and a surface tension of the first liquid is lower than a surface tension of the second liquid.

20 Claims, 12 Drawing Sheets

(51) Int. Cl.
    *B05C 11/10*     (2006.01)
    *F16K 1/32*     (2006.01)
    *F16K 1/36*     (2006.01)
    *F16K 31/122*     (2006.01)
    *H01L 21/02*     (2006.01)
    *H01L 21/67*     (2006.01)

(52) U.S. Cl.
    CPC ............... *B05C 11/10* (2013.01); *F16K 1/32* (2013.01); *F16K 1/36* (2013.01); *F16K 31/1221* (2013.01); *H01L 21/02057* (2013.01); *H01L 21/02101* (2013.01); *H01L 21/67017* (2013.01); *H01L 21/6708* (2013.01)

(56) References Cited

FOREIGN PATENT DOCUMENTS

| | | | |
|---|---|---|---|
| JP | 2010171295 | A | 8/2010 |
| JP | 2013-071026 | A | 4/2013 |
| JP | 6443243 | B2 | 12/2018 |
| KR | 10-2010-0046752 | A | 5/2010 |
| KR | 10-2017-0052330 | A | 5/2017 |
| KR | 101776021 | B1 | 9/2017 |
| KR | 10-2017-0123467 | A | 11/2017 |
| TW | I722550 | B | 3/2021 |

OTHER PUBLICATIONS

Japanese Office Action, dated Jul. 4, 2023, issued in corresponding Japanese Patent Application No. 2022-087537.
Taiwanese Office Action dated Feb. 2, 2023 issued in corresponding Taiwanese Appln. No. 11220096450.

APPARATUS FOR TREATING SUBSTRATE USING LIQUID AND METHOD FOR CONTROLLING LIQUID

CROSS-REFERENCE TO RELATED APPLICATIONS

This application claims priority to and the benefit of Korean Patent Application No. 10-2021-0072353 filed in the Korean Intellectual Property Office on Jun. 3, 2021, the entire contents of which are incorporated herein by reference.

TECHNICAL FIELD

Embodiments of the inventive concept described herein relate to a liquid treating apparatus for treating a substrate with a chemical and a controlling method for a chemical for treating the substrate.

BACKGROUND

In general, a semiconductor device is manufactured by depositing various materials on a substrate in a form of a thin film and patterning the deposited materials. To this end, different processes of several stages, such as a deposition process, a photolithography process, an etching process, and a cleaning process, are required.

Among these processes, the etching process is a process of removing a film formed on the substrate, and the cleaning process is a process of removing contaminants remaining on a surface of the substrate after each unit process for manufacturing a semiconductor. The etching process and the cleaning process are classified into a wet method and a dry method according to a process progression method, and the wet method is classified into a batch-type method and a spin-type method.

The spin-type method fixes the substrate to a support unit capable of treating one substrate, supplies a chemical (e.g., an etching liquid, a cleaning liquid, or a rising liquid) to the substrate through a liquid supply nozzle while rotating the substrate to thereby clean the substrate by spreading the chemical on a top surface of the substrate by a centrifugal force, and dries the substrate in various methods after cleaning the substrate.

In a spin-type treating apparatus, a substrate cleaning is performed while rotating the substrate, and a static electricity is generated due to the chemical supplied to the substrate during the rotation and other causes. Such a static electricity affects the chemical exposed to an end of the nozzle. In other words, the static electricity causes a drop of the chemical formed the end of the nozzle, and causes specific defects such as a concentration phenomenon and an annular shape.

SUMMARY

Embodiments of the inventive concept provide a liquid treating apparatus and a liquid controlling method for improving a substrate treating efficiency.

Embodiments of the inventive concept provide a liquid treating apparatus and a liquid controlling method for controlling an occurrence of an abnormal radiation phenomenon due to a static electricity.

Embodiments of the inventive concept provide a liquid treating apparatus and a liquid controlling method for minimizing a pipe contamination due to a fume or the like generated by a pipe emptying during a process procedure.

Embodiments of the inventive concept provide a liquid treating apparatus and a liquid controlling method for controlling an occurrence of an abnormal radiation phenomenon due a static electricity generated by a low surface tension solution.

The technical objectives of the inventive concept are not limited to the above-mentioned ones, and the other unmentioned technical objects will become apparent to those skilled in the art from the following description.

The inventive concept provides a liquid treating apparatus. The liquid treating apparatus includes a spin chuck configured to support and rotate a substrate; and a liquid supply unit configured to supply a liquid to the substrate, and wherein the liquid supply unit comprises: a nozzle configured to discharge the liquid to the substrate; a flow path pipe configured to connect the nozzle and the liquid supply source; a valve assembly provided at the flow path pipe and configured to cut-off and suck-back a flow of the liquid within the flow path pipe, the valve assembly comprising: a cut-off valve configured to open and close a flow of a treating liquid within the flow path pipe; a suck-back valve provided adjacent to an end of the cut-off valve and configured to suck-back the liquid of the nozzle; and a first flow velocity controller configured to adjust a flow velocity of an air introduced into or outflowed from the cut-off valve; and a second flow velocity controller configured to adjust a flow velocity of an air introduced into or outflowed from the suck-back valve, and wherein the second flow velocity controller controls a suck-back moving speed of the liquid to be 10 mm/s or lower.

In an embodiment, the liquid treating apparatus further includes an air regulator for adjusting an air pressure applied to the suck-back valve to a first pressure or below, and wherein the first pressure which is an air pressure applied to the suck-back valve is different from a second pressure applied to the cut-off valve.

In an embodiment, the first air pressure is lower than the second air pressure.

In an embodiment, the liquid treating apparatus further includes: a main air line connected to a pressurized air supply source; a first air line branching from the main air line and connected to the suck-valve; and a second air line branching from the main air line and connected to the cut-off valve, and wherein the air regulator and a first flow velocity regulator are provided at the first air line, and a second flow velocity regulator is provided at the second air line.

In an embodiment, The liquid treating apparatus, further comprise: a first air line, wherein an end of the first air line is connected to a first open/close valve configured to control an open/close of an introduction of a pressurized air adjusted to the first pressure, and the other end of the first air line is connected to the suck-back valve and configured to supply a pressurized air to the suck-back valve; and a second air line, an end of the second air line is connected to a second open/close valve configured to control an open/close of an introduction of a pressurized air adjusted to the second pressure which is different from the first pressure, the other end of the second air line is connected to the cut-off valve, and wherein the second air line configured to supply a pressurized air to the cut-off valve.

In an embodiment, the first pressure is lower than the second pressure.

In an embodiment, a first spring constant which is a spring constant of a spring provided at the suck-back valve is higher than a second spring constant which is a spring constant of a spring provided at the cut-off valve.

In an embodiment, the valve assembly is installed within 350 mm from the nozzle with respect to the flow path pipe connected to the nozzle and the valve assembly.

In an embodiment, the liquid supply unit comprises an arm, and wherein the nozzle is provided coupled to an end of the arm, and the valve assembly is provided at the arm.

In an embodiment, a height of which the liquid rises from an end of the nozzle by being sucked-back by the suck-back valve is 20 mm or lower.

In an embodiment, the liquid is an organic solvent.

In an embodiment, the organic solvent is an IPA.

The inventive concept provides a liquid treating apparatus. The liquid treating apparatus includes a spin chuck configured to support and rotate a substrate; and a liquid supply unit configured to supply a liquid to the substrate, and wherein the liquid supply unit comprises: a first nozzle connected to a first flow path pipe and configured to discharge a first liquid to the substrate; a first valve assembly including a first cut-off valve for cutting-off a flow of the first liquid within the first flow path pipe and a first suck-back valve for sucking-back the first liquid, and installed at the first flow pipe; a second nozzle connected to a second flow path pipe and configured to discharge a second liquid to the substrate; a second valve assembly including a second cut-off valve for cutting-off a flow of the second liquid within the second flow path pipe and a second suck-back valve for sucking-back the second liquid, and installed at the second flow pipe path; a first flow velocity controller configured to adjust an air flow velocity of an air introduced into or outflowed from the first suck-back valve; and a second flow velocity controller configured to adjust an air flow velocity of an air introduced into or outflowed from the second suck-back valve, and wherein a first speed of a suck-back speed provided by the first valve assembly is slower than a second suck-back speed provided by the second valve assembly, and a surface tension of the first liquid is lower than a surface tension of the second liquid.

In an embodiment, a speed of an air outflowed from the first suck-back valve is set slower than a speed of an air outflowed from the second suck-back valve at the first speed controller and the second speed controller.

In an embodiment, the first speed is 10 m/s or lower.

In an embodiment, a first air pressure which is an air pressure applied to operate the first suck-back valve is lower than a second air pressure which is an air pressure applied to operate the second suck-back valve.

In an embodiment, a first spring constant which is a spring constant of a spring provided at the first suck-back valve is higher than a second spring constant which is a spring constant of a spring provided at the second suck-back valve.

In an embodiment, the first valve assembly is installed within 350 mm from the nozzle with respect to the flow path pipe connected to the first nozzle and a valve assembly.

In an embodiment, the liquid supply unit comprises at least one arm, and wherein the first nozzle is provided coupled to one end of an arm, and the first valve assembly is provided at the arm couped to the first nozzle.

In an embodiment, a height of which the first liquid rises from an end of the nozzle due to being sucked-back by the first suck-back valve is 20 mm or lower.

In an embodiment, the first liquid is an IPA.

The inventive concept provides a method for controlling a cut-off of a liquid supplied with respect to a rotating substrate. The method includes providing a first valve assembly at a first liquid supply path extending to a first nozzle; and providing a second valve assembly at a second liquid supply path extending to a second nozzle; and wherein the first valve assembly includes a first cut-off valve and a first suck-back valve provided adjacent to a downstream of the first cut-off valve, and the second valve assembly includes a second cut-off valve and a second suck-back valve provided adjacent to a downstream of the second cut-off valve, and a surface tension of the first liquid is lower than a surface tension of the second liquid, and a first speed which is a suck-back speed provided by the first valve assembly is slower than a second speed which is a suck-back speed provided by the second valve assembly.

In an embodiment, a speed of an air outflowed from the first suck-back valve is lower than a speed of an air outflowed from the first cut-off valve.

In an embodiment, a first air pressure which is an air pressure applied to the first suck-back valve, and a second air pressure applied to the first cut-off valve is different.

In an embodiment, the first air pressure is lower than the second air pressure.

In an embodiment, a first spring constant which is a spring constant of a spring provided at the first suck-back valve is higher than a second spring constant which is a spring constant of a spring provided at the second cut-off valve.

In an embodiment, a height of which the first liquid rises from an end of the first nozzle by being sucked-back by the first suck-back valve is 20 mm or lower.

In an embodiment, a suck-back moving speed of the first liquid at a suck-back operation of the first suck-back valve is controlled to be 10 mm/s or lower.

In an embodiment, the first air pressure which is an air pressure applied for to operate the first suck-back valve is lower than the second air pressure which is an air pressure applied to operate the second suck-back valve.

In an embodiment, the first liquid is an organic solvent.

In an embodiment, the organic solvent is an IPA.

According to an embodiment of the inventive concept, a substrate treating efficiency may be improved.

According to an embodiment of the inventive concept, an occurrence of an abnormal radiation phenomenon due to a static electricity may be controlled.

According to an embodiment of the inventive concept, a pipe contamination? due to a fume or the like generated by a pipe emptying during a process procedure may be minimized.

According to an embodiment of the inventive concept, an occurrence of an abnormal radiation phenomenon due to a static electricity generated by a low surface tension solution may be controlled.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
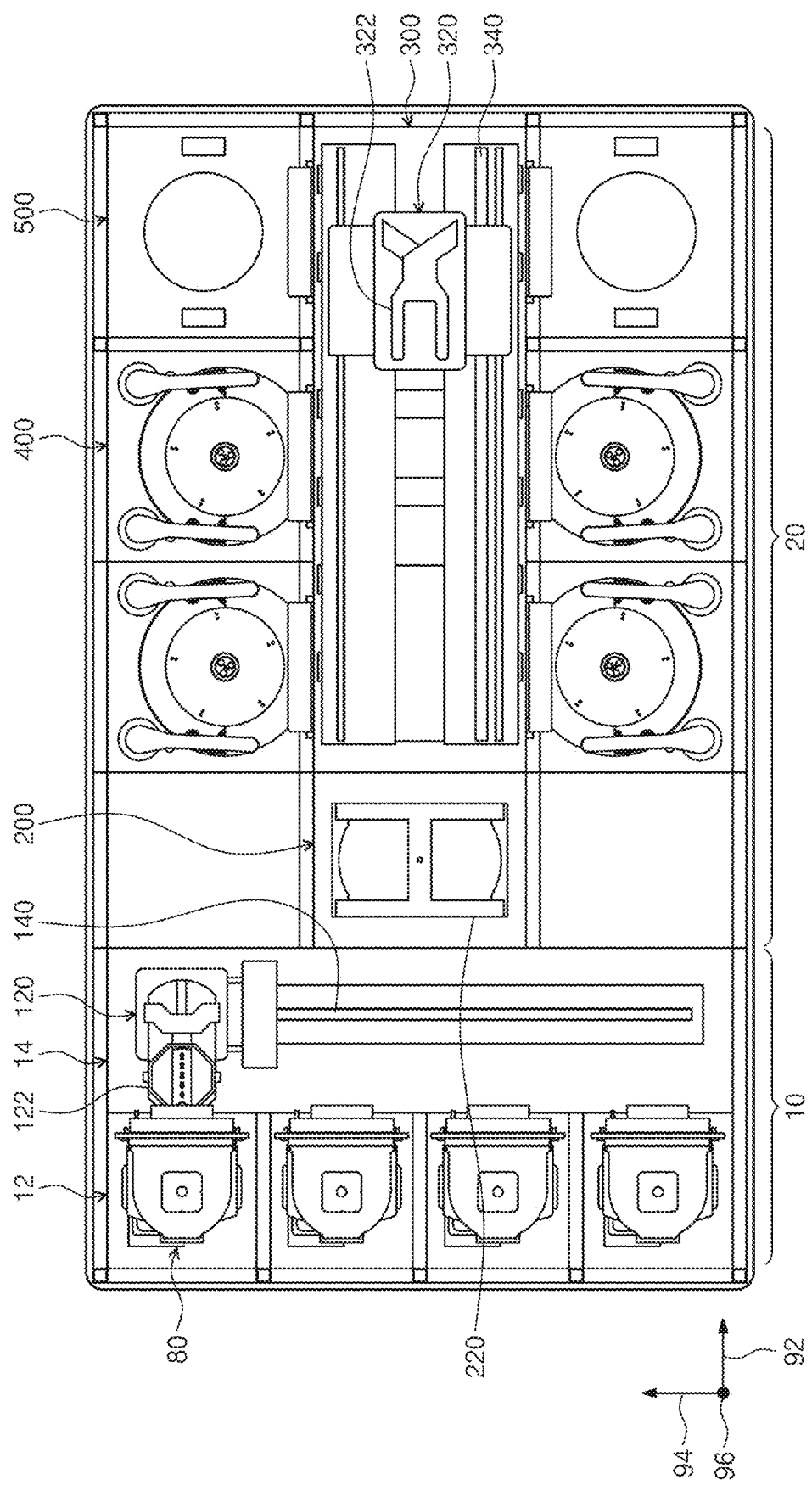
FIG. 1 is a plan view schematically illustrating a substrate treating apparatus according to an embodiment of the inventive concept.

Hereinafter, embodiments of this invention will be described in detail with reference to the accompanying drawings so that those of ordinary skill in the technical field to which this invention belongs can easily implement this invention. However, the inventive concept may be implemented in various different forms and is not limited to the embodiments described herein. In addition, in describing a correct embodiment of the inventive concept in detail, when it is determined that a detailed description of related known functions or configurations may unnecessarily obscure the gist of the inventive concept, the detailed description thereof will be omitted. In addition, a same sign is used throughout the drawing for parts with similar functions and actions.

To "include" or "comprise" a component means that it may include more other components, not excluding other components unless otherwise stated. Specifically, the term "include", "comprise", or "have" should be understood to designate that there are features, numbers, steps, operations, components, or a combination thereof described in the specification, and do not preclude the presence or addition of one or more other features or numbers, steps, operations, components, or combinations thereof.

The singular expression includes plural expressions unless the context clearly implies otherwise. In addition, shapes and sizes of elements in the drawings may be exaggerated for clearer explanation.

The term "and/or" includes any one of the listed items and all combinations of one or more. In addition, in the present specification, the term "connected" means not only a case where member A and member B are directly connected, but also a case where member C is interposed between member A and member B to indirectly connect member A and member B.

Embodiments of the inventive concept may be modified in various forms, and the scope of the inventive concept should not be construed as being limited to the following embodiments. The embodiment of the inventive concept is provided to more fully explain the inventive concept on to those with average knowledge in the art. Therefore, the shape of the elements in the drawing has been exaggerated to emphasize a clearer explanation.

FIG. 1 is a plan view schematically illustrating a substrate treating system according to an embodiment of the inventive concept.

Referring to FIG. 1, the substrate treating system includes an index module 10, a treating module 20, and a controller (not shown). According to an embodiment, the index module 10 and the treating module 20 are disposed in a direction. Hereinafter, a direction in which the index module 10 and the treating module 20 are disposed is referred to as a first direction 92, a direction perpendicular to the first direction 92 when viewed from above is referred to as a second direction 94, and a direction perpendicular to both the first direction 92 and the second direction 94 is referred to as a third direction 96.

The index module 10 transfers the wafer W from a container 80 in which the wafer W is stored to the treating module 20, and stores a wafer W in which a treatment has been completed at the treating module 20 to the container 80. A lengthwise direction of the index module 10 is provided in the second direction 94. The index module 10 has a load port 12 and an index frame 14. The load port 12 is located on an opposite side of the treating module 20 based on the index frame 14. The container 80 in which the wafers W are stored is placed on the load port 12. The load port 12 may be provided in a plurality, and the plurality of load ports 12 may be disposed along the second direction 94.

As the container 80, a sealed container such as a front open integrated pod (FOUP) may be used. The container 80 may be placed on the load port 12 by a transfer means (not shown) such as an overhead transfer, an overhead conveyor, or an automatic guided vehicle or by an operator.

An index robot 120 is provided at the index frame 14. A guide rail 140 with its lengthwise direction in the second direction 94 may be provided within the index frame 14, and the index robot 120 may be provided to be movable along the guide rail 140. The index robot 120 may include a hand 122 on which the wafer W is placed, and the hand 122 may be forwardly and backwardly movable, rotatable with the third direction 96 as an axis, and movable along the third direction 96. The hand 122 are provided in a plurality to be spaced apart in an up/down direction, and the hands 122 may be forwardly and backwardly movable independently from each other.

The treating module 20 includes a buffer unit 200, a transfer apparatus 300, a liquid treating apparatus 400, and a supercritical treating apparatus 500. The buffer unit 200 provides a space in which a wafer W carried into the treating module 20 and a wafer W carried out from the treating module 20 temporarily remain. The liquid treating apparatus 400 performs a liquid treating process of liquid-treating the wafer W by supplying a liquid onto the wafer W. The supercritical treatment apparatus 500 performs a drying process of removing a liquid remaining on the wafer W. The transfer apparatus 300 transports the wafer W between the buffer unit 200, the liquid treating apparatus 400, and the supercritical treating apparatus 500.

The transport apparatus 300 may be provided with its lengthwise direction in the first direction 92. The buffer unit 200 may be disposed between the index module 10 and the transfer apparatus 300. The liquid treating apparatus 400 and the supercritical treating apparatus 500 may be disposed at a side of the transfer apparatus 300. The liquid treating apparatus 400 and the transfer apparatus 300 may be disposed in the second direction 94. The supercritical treating apparatus 500 and the transfer apparatus 300 may be disposed in the second direction 94. The buffer unit 200 may be located at an end of the transfer apparatus 300.

According to an embodiment, the liquid treating apparatuses 400 may be disposed on both sides of the transfer apparatus 300, the supercritical treating apparatuses 500 may be disposed on both sides of the transfer apparatus 300, and the liquid treating apparatuses 400 may be disposed closer to the buffer unit 200 than the supercritical treating apparatuses 500. At a side of the transfer apparatus 300, the liquid treating apparatuses 400 may be provided in an array of A×B (A and B are natural numbers greater than 1 or 1), respectively, along the first direction 92 and the third direction 96. In addition, at a side of the transfer apparatus 300, each of the supercritical treating apparatuses 500 may be provided with C×D (C and D are natural numbers greater than 1 or 1) in the first direction 92 and the third direction 96. Unlike the above-described, only the liquid treating apparatuses 400 may be provided on a side of the transfer apparatus 300, and only the supercritical treating apparatuses 500 may be provided another side.

The transfer apparatus 300 has a transfer robot 320. A guide rail 340 provided with its lengthwise direction in the first direction 92 may be provided within the transfer apparatus 300, and the transfer robot 320 may be provided to be movable on the guide rail 340. The transfer robot 320 may include a hand 322 on which the wafer W is placed, and the hand 322 may be provided to be forwardly and backwardly movable, rotatable with the third direction 96 as an axis, and movable along the third direction 96. The hand 322 may be provided in a plurality to be spaced apart from each other in the up/down direction, and the hands 322 may be forwardly and backwardly movable independently from each other.

The buffer unit 200 includes a plurality of buffers 220 in which the wafer W is placed. The buffers 220 may be disposed to be spaced apart from each other along the third direction 96. A front face and a rear face of the buffer unit 200 are opened. The front face is a surface facing the index module 10, and the rear face is a surface facing the transfer apparatus 300. The index robot 120 may access the buffer unit 200 through the front face, and the transfer robot 320 may access the buffer unit 200 through the rear face.

A controller (not shown) may control the substrate treating system. The controller may control components of the substrate treating system so the substrate is treated according to a set process. Also, the controller may comprise a process controller consisting of a microprocessor (computer) that executes a control of the substrate treating system, a user interface such as a keyboard via which an operator inputs commands to manage the substrate treating apparatus, and a display showing the operation situation of the substrate treating apparatus, and a memory unit storing a treating recipe, i.e., a control program to execute treating processes of the substrate treating system by controlling the process controller or a program to execute components of the substrate treating apparatus according to data and treating conditions. In addition, the user interface and the memory unit may be connected to the process controller. The treating recipe may be stored in a storage medium of the storage unit, and the storage medium may be a hard disk, a portable disk, such as a CD-ROM or a DVD, or a semiconductor memory, such as a flash memory.

Figure 2:
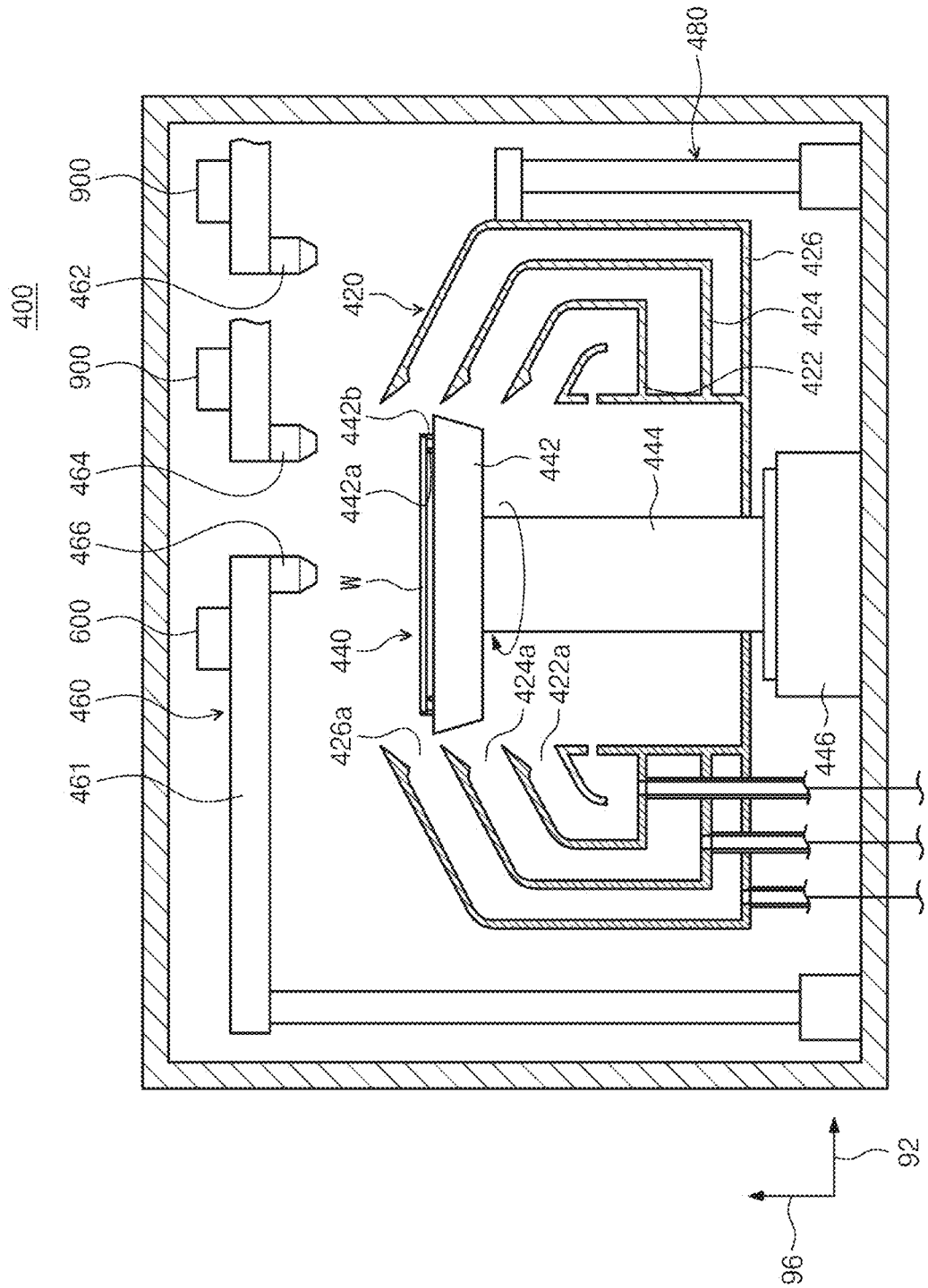
FIG. 2 schematically illustrates an embodiment of a liquid treating apparatus of FIG. 1.

FIG. 2 schematically illustrates an embodiment of the liquid treating chamber 400 of FIG. 1. Referring to FIG. 2, the liquid treating apparatus 400 has a housing 410, a cup 420, a support unit 440, a liquid supply unit 460, and a lifting/bottoming unit 480. The housing 410 is provided in a substantially rectangular parallelepiped shape. The cup 420, the support unit 440, and the liquid supply unit 460 are disposed within the housing 410.

The cup 420 may have a treating space with an open top. The wafer W may be liquid-treated within the treating space. The support unit 440 supports the wafer W within the treating space. The liquid supply unit 460 supplies a liquid onto the wafer W supported by the support unit 440. The liquid may be provided in a plurality of types and may be sequentially supplied onto the wafer W. The lifting/bottoming unit 480 adjusts a relative height between the cup 420 and the support unit 440.

According to an embodiment, the cup 420 has a plurality of recollecting containers 422, 424, and 426. Each of the recollecting containers 422, 424, and 426 has a recollecting space for recollecting a liquid used for a substrate treatment. Each of the recollecting containers 422, 424, and 426 is provided in a ring shape surrounding the support unit 440. During the liquid treatment process, all of a chemical scattered by a rotation of the wafer W is introduced into the recollecting space through an inlet 422a, 424a, and 426a of the respective recollecting container 422, 424, and 426. According to an embodiment, the cup 420 has a first recollecting container 422, a second recollecting container 424, and a third recollecting container 426. The first recollecting container 422 is disposed to surround the support unit 440, the second recollecting container 424 is disposed to surround the first recollecting container 422, and the third recollecting container 426 is disposed to surround the second recollecting container 424. The second inlet 424a introducing a liquid into the second recollecting container 424 may be positioned above the first inlet 422a introducing a liquid into the first recollecting container 422, and the third inlet 426a introducing a liquid into the third recollecting container 426 may be positioned above the second inlet 424a.

The support unit 440 has a support plate 442 and a drive shaft 444. A top surface of the support plate 442 is generally provided in a circular shape and may have a diameter larger than a diameter of the wafer W. A support pin 442a supporting a bottom surface of the wafer W is provided at a center of the support plate 442, and the support pin 442a is provided such that a top end thereof protrudes from the support plate 442 so that the wafer W is spaced apart from the support plate 442 by a predetermined distance. A chuck pin 442b is provided at an edge of the support plate 442. The chuck pin 442b is provided to upwardly protrude from the support plate 442, and supports a side of the wafer W so that the wafer W is not separated from the support unit 440 when the wafer W is rotated. The drive shaft 444 is driven by the driver 446, is connected to a center of the bottom surface of the wafer W, and rotates the support plate 442 based on a center axis thereof.

According to an embodiment, the liquid supply unit 460 may include a first nozzle 462, a second nozzle 464, and a third nozzle 466. The first nozzle 462 may supply a first liquid onto the wafer W. The first liquid may be a liquid for removing a film or a foreign material remaining on the wafer W. The second nozzle 464 may supply a second liquid onto the wafer W. The second liquid may be a liquid that is well soluble in a third liquid. For example, the second liquid may be a liquid that is better soluble in the third liquid than the first liquid. The second liquid may be a liquid that neutralizes the first liquid supplied onto the wafer W. In addition, the second liquid may be a liquid that neutralizes the first liquid and dissolves better in the third liquid than the first liquid at the same time. According to an embodiment, the second liquid may be a water. The third nozzle 466 may supply the third liquid onto the wafer W. The third liquid may be a liquid having a high dissolvability in the supercritical fluid used in the supercritical treating chamber 500. For example, the third liquid may be more dissolvable in the supercritical fluid used at the supercritical treating chamber 500 than the second liquid. According to an embodiment, the third liquid may be an organic solvent. The organic solvent may be an isopropyl alcohol IPA. According to an embodiment, the supercritical fluid may be a carbon dioxide. The first nozzle 462, the second nozzle 464, and the third nozzle 466 may be supported by different arms 461. The arms 461 may be moved independently. Optionally, the first nozzle 462, the second nozzle 464, and the third nozzle 466 may be mounted on a same arm 461 and moved simultaneously.

The lifting/bottoming unit 480 moves the cup 420 in the up/down direction. A relative height between the cup 420 and the wafer W is changed by an up/down movement of the cup 420. As a result, the recollecting containers 422, 424, and 426 for recollecting a chemical are changed depending on a type of liquid supplied to the wafer W, so that the liquids can be separately recollected. Unlike the above description, the cup 420 is fixedly installed, and the lifting/bottoming unit 480 may move the support unit 440 in the up/down direction.

Figure 3:
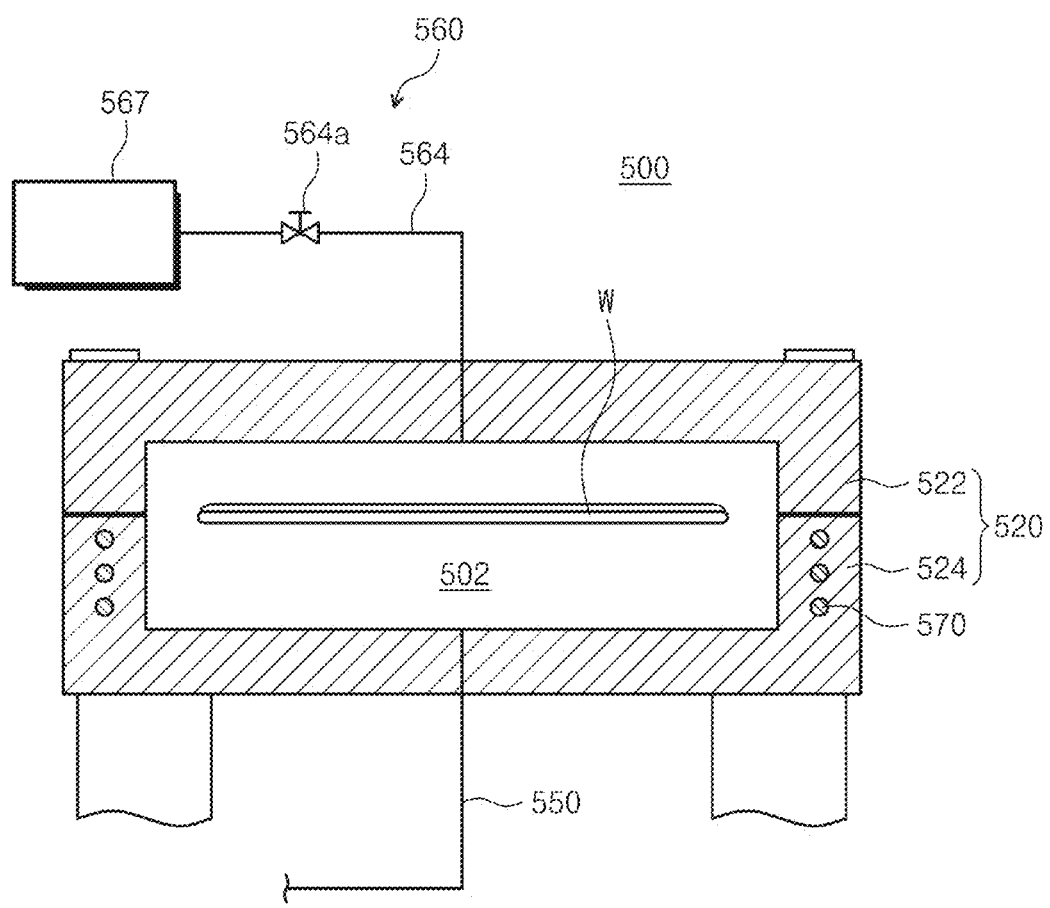
FIG. 3 schematically illustrates an embodiment of a supercritical treating apparatus of FIG. 1.

FIG. 3 is a view schematically illustrating an embodiment of the supercritical treating apparatus of FIG. 1. The supercritical treating apparatus 500 removes the liquid on the wafer W using the supercritical fluid. The supercritical treating apparatus 500 includes a vessel 520, a support member (not shown), a fluid supply unit 560, and a blocking plate (not shown).

The vessel 520 provides a treating space 502 in which the supercritical process is performed. The vessel 520 has a top vessel (top body) 522 and a bottom vessel 524 (bottom body) 524, and the top vessel 522 and the bottom vessel 524 are combined with each other to provide the above-described treating space 502. The top vessel 522 is provided at a top portion of the bottom vessel 524. A position of the top vessel 522 may be fixed, and the bottom vessel 524 may be lifted/bottomed by a driving member 590 such as a cylinder. When the bottom vessel 524 is spaced apart from the top vessel 522, the treating space 502 is opened, and at this time, the wafer W is brought in or taken out. During the process, the bottom vessel 524 is in close contact with the top vessel 522, so that the treating space 502 is sealed from the outside.

The supercritical treating apparatus 500 has a heater 570. According to an embodiment, the heater 570 is located inside a wall of the vessel 520. According to an embodiment, the heater 570 may be provided to at least one of the top vessel 522 or the bottom vessel 524. The heater heats the treating space 502 of the vessel 520 so that the fluid supplied into the inner space of the vessel 520 maintains a supercritical state. The treating space 502 forms an atmosphere according to the supercritical fluid.

The support member (not shown) supports the wafer W in the treating space 502 of the vessel 520. The support member (not shown) has a fixing rod (not shown) and a holder (not shown). The fixing rod (not shown) is fixedly installed on the top vessel 522 to downwardly protrude from a bottom surface of the top vessel 522. The fixing rod (not shown) is provided with its lengthwise direction in the up/down direction. A plurality of fixing rods (not shown) are provided and are spaced apart from each other. The fixing rods (not shown) are disposed so that the wafer W does not interfere with the fixing rods (not shown) when the wafer W is brought into or taken out of the space surrounded by them. The holder (not shown) is coupled to each of the fixing rods (not shown). The holder (not shown) extends from a bottom end of the fixing rod (not shown) toward the ground. According to an embodiment, the holder (not shown) extends in a shape capable of supporting a bottom circumference of the wafer W to support a bottom surface of the wafer W to be supported.

The fluid supply unit 560 supplies a process fluid to the treating space 502 of the vessel 520. According to an embodiment, the process fluid may be supplied to the treating space 502 in the supercritical state. In contrast, the process fluid may be supplied to the treating space 502 in a gas state, and may be phase-changed to the supercritical state within the treating space 502. According to an embodiment, the fluid supply unit 560 has a top supply line 564. In another embodiment, the fluid supply unit 560 has a top supply line 564 and a bottom supply line (not shown). The bottom supply line (not shown) branches from the top supply line 564. The top supply line 564 couples with the top vessel 522 to supply a cleaning fluid toward a top surface of the wafer W placed on the support member. According to an embodiment, the top supply line 564 is coupled to a center of the top vessel 522. The bottom supply line (not shown) is coupled to the bottom vessel 524 to supply the cleaning fluid toward a bottom surface of the wafer W placed on the support member. According to an embodiment, the bottom supply line (not shown) is coupled to the center of the bottom vessel 524.

An exhaust unit 550 is coupled to the bottom vessel 524. The supercritical fluid within the treating space 502 of the vessel 520 is exhausted to the outside of the vessel 520 through the exhaust unit 550.

The blocking plate (not shown) may be disposed within the treating space 502 of the vessel 520. The blocking plate (not shown) may be provided in a disk shape. The blocking plate (not shown) is supported by the support member (not shown) to be upwardly spaced apart from the bottom surface of the vessel 520. A plurality of support members (not shown) are provided in a rod shape, and are disposed so as to be spaced apart from each other by a predetermined distance. When viewed from above, the blocking plate (not shown) may be provided to overlap an outlet of the bottom supply line (not shown) and an inlet of the exhaust unit (not shown). The blocking plate (not shown) may prevent the wafer W from being damaged by directly discharging the cleaning fluid supplied through the bottom supply line 566 toward the wafer W.

Figure 4:
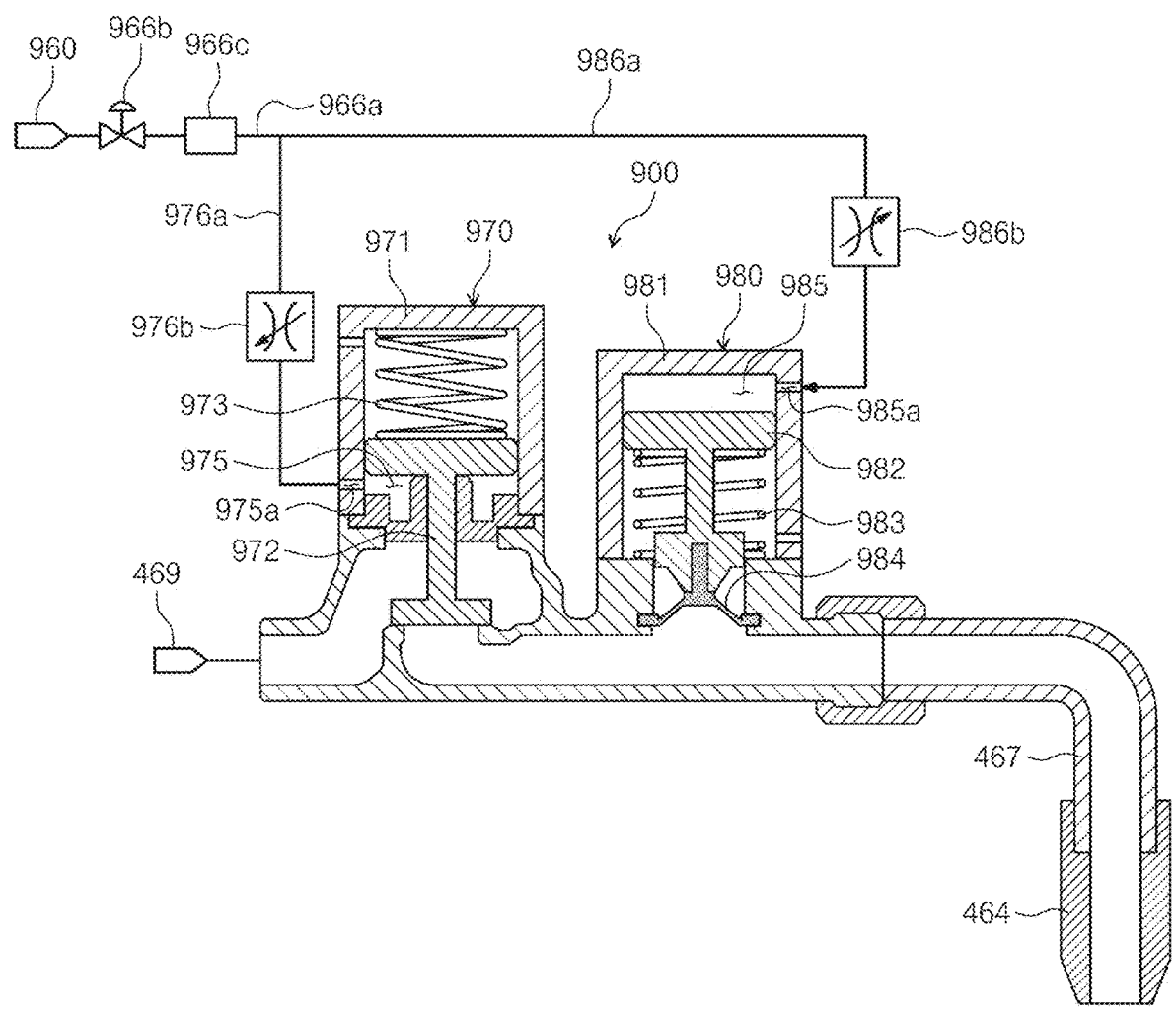
FIG. 4 is a cross-sectional view illustrating a state in which a valve assembly 900 of FIG. 2 is installed in a chemical flow path.

FIG. 4 is a cross-sectional view illustrating a state in which the valve assembly 900 of FIG. 2 is installed in a chemical flow path. The valve assembly 900 will be described with reference to FIG. 4.

To describe the valve assembly 900, the valve assembly 900 connected to the second nozzle 464 is used as an example. The chemical supply source 469 is connected to the second nozzle 464 by a flow path pipe. The chemical supply source 469 is a supply source supplying the second liquid. A valve assembly 900 is provided at the flow path pipe. A pump (not shown) and a filter (not shown) may be disposed upstream of the valve assembly 900.

The valve assembly 900 includes a cut-off valve 970 and a suck-back valve 980. The cut-off valve 970 opens and closes a flow of the chemical. After discharging the chemical, the suck-back valve 980 sucks and retracts a certain amount of the chemical existing at an end of the nozzle 464, thereby preventing the chemical from dripping.

The cut-off valve 970 has a valve body 971. A piston member 972 capable of moving in the up/down direction is installed within the valve body 971. The piston member 972 includes a piston, a shaft, and a disk. The shaft is coupled to a bottom end of the piston. The disk is coupled to a bottom of the shaft. A spring 973 is installed above the piston member 972. A bottom end of the spring 973 contacts a top surface of the piston member 972, and a top end of the spring 973 contacts an inner surface of a top wall of the valve body 971.

When an air is introduced into a space under the piston 975 of the piston member 972 through an inlet 975a formed on a sidewall of the valve body 971, the piston member 972 moves upwardly. And when the air is exhausted, the piston member 972 is moved downwardly by a restoring force of the spring 973 installed above the piston member 972. In this manner, the piston member 972 moves in the up/down direction, and the disk moves in the up/down direction according to the up/down movement of the piston member 972 to open and close a flow path formed at the valve body 971.

The suck-back valve 980 is disposed adjacent to a downstream of the cut-off valve 970. The suck-back valve 980 may be integrally provided with the cut-off valve 970. The suck-back valve 980 has a valve body 981. A piston member 982 capable of moving in the up/down direction is installed within the valve body 981. The piston member 982 includes a piston, a shaft, and a diaphragm 984. The shaft is coupled to a bottom surface of the piston in the up/down direction, and the diaphragm 984 is coupled to a bottom end of the shaft. The spring 983 is installed at the bottom part of the piston to surround the shaft. A top end of the spring 983 contacts the bottom surface of the piston, and a bottom end of the spring 983 contacts a protruding part formed on an inner surface of a sidewall of the valve body 981. The diaphragm 984 coupled to the bottom end of the shaft is at a bottom part of the protruding part.

When an air flows into a space above the piston 985 of the piston member 982 through an inlet 985a formed on a sidewall of the valve body 981, the piston member 982 moves downwardly. And when the air is exhausted through the inlet 985a, the piston member 982 is moved upwardly by the restoring force of the spring 983 installed below the piston. In this way, the piston member 982 moves in the up/down direction, and the diaphragm 984 moves in the up/down direction according to the up/down movement of the piston member 982. A flow path formed at the suck-back valve 980 communicates with a flow path formed at the cut-off valve 970.

A first flow velocity controller 976b is connected to the inlet 975a of the cut-off valve 970 by a first air line 976a. The first flow velocity controller 976b adjusts an amount of an air introduced/outflowed through the inlet 975a of the cut-off valve 970. A second flow velocity controller 986b is connected to the inlet 985a of the suck-back valve 980 by a second air line 986a. The second flow velocity controller 986b adjusts an amount of an air introduced/outflowed through the inlet 985a of the suck-back valve 980.

The first flow velocity controller 976b and the second flow velocity controller 986b may be provided in a manner in which a meter-in type controller capable of adjusting a flow rate of an air during a supply and a meter-out type controller capable of controlling a flow rate of an air during an exhaust are integrally mixed.

According to an embodiment, the first air line 976a and the second air line 986a are branched from the main air line 966a. A valve such as a solenoid valve 966b may be installed at the main air line 966a. The solenoid valve 966b opens and closes a flow of an air within the main air line 966a. In addition, a regulator 966c may be installed at the main air line 660. The regulator 966c keeps a pressure of an air passing through the regulator 966c constant.

A flow of an air supplied through the main air line 966a branches into the first air line 976a and the second air line 986a. The branched air flows into the first flow velocity controller 976b and the second flow velocity controller 986b, respectively, and the first flow velocity controller 976b and the second flow velocity controller 986b supply a flow rate of the air to the first air line 976a and the second air line 986a. When an air is supplied to the cut-off valve 970 through the first air line 976a, the piston member 972 moves upwardly and a flow path of the flow path pipe is in an open state. And when an air is supplied to the suck-back valve 980 through the second air line 986a, the piston member 982 moves downwardly. At this time, a chemical supplied from the chemical supply source 468 passes through flow paths of the cut-off valve 970 and the suck-back valve 980 and is discharged to an outside through the nozzle 464.

When a discharge of the chemical through the nozzle 464 is completed, a supply of an air through the main air line 966a is stopped, and an air supplied to the cut-off valve 970 and the suck-back valve 980 is exhausted. A flow rate of an air exhausted from the cut-off valve 970 is controlled by the first flow velocity controller 976b, and a flow rate of an air exhausted from the suck-back valve 980 is controlled by the second flow velocity controller 986b. When an air is exhausted from the cut-off valve 970, the piston member 972 moves downwardly by a restoring force of the spring 973 and switches a flow path of the piston member 972 to a closed state. When an air is exhausted from the suck-back valve 980, the piston member 982 moves upwardly by the restoring force of the spring 983, and the diaphragm 984 of the piston member 972 moves upwardly to perform a suck-back operation of sucking the chemical.

The first flow velocity controller 976b may adjust a flow velocity of an air flowing out from the cut-off valve 970 as well as a flow velocity of an air flowing into the cut-off valve 970. The second flow velocity controller 986b may adjust a flow velocity of an air flowing out from the suck-back valve 980 as well as a flow velocity of an air flowing into the suck-back valve 980.

Figure 5:
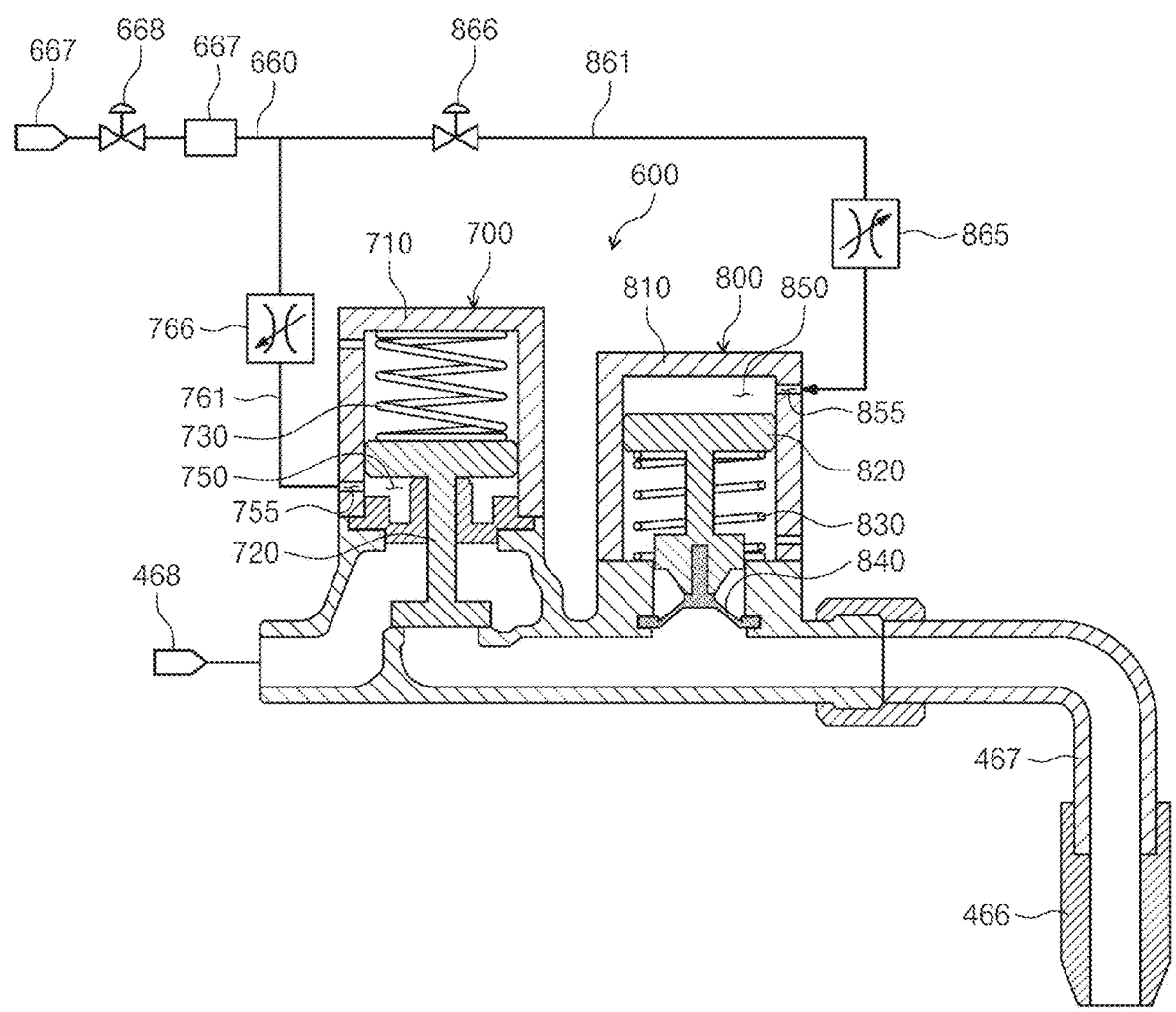
FIG. 5 is a cross-sectional view illustrating a valve assembly 600 according to a first embodiment of the inventive concept and a state in which the valve assembly is installed in the chemical flow path.

FIG. 5 is a cross-sectional view illustrating a valve assembly according to a first embodiment of the inventive concept and a state in which the valve assembly is installed at a chemical flow path.

Referring to FIG. 5, the liquid supply unit 460 includes a chemical supply source 468, a flow path pipe 467, a valve assembly 600, and a nozzle 466. In an embodiment, the nozzle 466 may be provided as the third nozzle 466 described above. The chemical supply source 468 is connected to the nozzle 466 by the flow path pipe 467. A valve assembly 600 is provided on the flow path pipe 467. A pump (not shown) and a filter (not shown) may be disposed upstream of the valve assembly 600.

The valve assembly 600 includes a cut-off valve 700 and a suck-back valve 800. The cut-off valve 700 opens and closes a flow of the chemical. After discharging the chemical, the suck-back valve 800 sucks a certain amount of the chemical existing at a tip of the nozzle 466 and sucks it, thereby preventing the chemical from dripping.

The cut-off valve 700 has a valve body 710. A piston member 720 capable of moving in the up/down direction is installed within the valve body 710. The piston member 720 includes a piston, a shaft, and a disk. The shaft is coupled to a bottom end of the piston. The disk is coupled to a bottom of the shaft. A spring 730 is installed above the piston member 720. A bottom end of the spring 730 contacts a top surface of the piston member 720, and a top end of the spring 730 contacts an inner surface of a top wall of the valve body 710.

When an air is introduced into a space under the piston 750 of the piston member 720 through an inlet 755 formed on a sidewall of the valve body 710, the piston member 720 moves upwardly. And when the air is exhausted, the piston member 720 is moved downwardly by a restoring force of the spring 730 installed above the piston member 720. In this manner, the piston member 720 moves in the up/down direction, and the disk moves in the up/down direction according to the up/down movement of the piston member 720 to open and close a flow path formed at the valve body 710.

The suck-back valve 800 is disposed adjacent to a downstream of the cut-off valve 700. The suck-back valve 800 may be integrally provided with the cut-off valve 700. The suck-back valve 800 has a valve body 810. A piston member 820 capable of moving in the up/down direction is installed within the valve body 810. The piston member 820 includes a piston, a shaft, and a diaphragm 840. The shaft is coupled to a bottom surface of the piston in the up/down direction, and the diaphragm 840 is coupled to a bottom end of the shaft. The spring 830 is installed at the bottom part of the piston to surround the shaft. A top end of the spring 830 contacts the bottom surface of the piston, and a bottom end of the spring 830 contacts a protruding part formed on an inner surface of a sidewall of the valve body 810. The diaphragm 840 coupled to the bottom end of the shaft is at a bottom part of the protruding part.

When air is introduced into a space above the piston 850 of the piston member 820 through an inlet 855 formed on a sidewall of the valve body 810, the piston member 820 moves downwardly. And when the air is exhausted through the inlet 855, the piston member 820 is moved upwardly by the restoring force of the spring 830 installed below the piston. In this way, the piston member 820 moves in the up/down direction, and the diaphragm 840 moves in the up/down direction according to the up/down movement of the piston member 820. A flow path formed at the suck-back valve 800 communicates with a flow path formed at the cut-off valve 700.

The first flow velocity controller 766 is connected to the inlet 755 of the cut-off valve 700 by a first air line 761. The first flow velocity controller 766 adjusts an amount of an air introduced/outflowed through the inlet 755 of the cut-off valve 700. A second flow velocity controller 866 is connected to the inlet 855 of the suck-back valve 800 by a second air line 861. The second flow velocity controller 866 adjusts a velocity of an air introduced/outflowed through the inlet 855 of the suck-back valve 800.

The first flow velocity controller 766 and the second flow velocity controller 866 may be provided in a manner in which a meter-in type controller capable of adjusting a flow rate of air during a supply and a meter-out type controller capable of controlling a flow rate of an air during an exhaust are integrally mixed.

According to the first embodiment, the first air line 761 and the second air line 861 are branched from the main air line 660. A valve such as a solenoid valve 667 may be installed at the main air line 660. The solenoid valve (not shown) opens and closes a flow of an air within the main air line 660. In addition, a regulator 668 may be installed at the main air line 660. The regulator 668 keeps a pressure of an air passing through the regulator 668 constant.

A flow of an air supplied through the main air line 660 branches into the first air line 761 and the second air line 861. The branched air flows into the first flow velocity controller 766 and the second flow velocity controller 866, respectively, and the first flow velocity controller 766 and the second flow velocity controller 866 supply a flow rate of the air to the first air line 761 and the second air line 861. When the air is supplied to the cut-off valve 700 through the first air line 761, the piston member 720 moves upwardly and a flow path of the flow path pipe 467 is opened. And when an air is supplied to the suck-back valve 800 through the second air line 861, the piston member 820 is moved downwardly. At this time, a chemical supplied from the chemical supply source 468 passes through the flow paths of the cut-off valve 700 and the suck-back valve 800 and is discharged to an outside through the nozzle 466.

When a discharge of the chemical through the nozzle 466 is completed, a supply of an air through the main air line 660 is stopped, and an air supplied to the cut-off valve 700 and the suck-back valve 800 is exhausted. A flow rate of an air exhausted from the cut-off valve 700 is controlled by the first flow velocity controller 766, and a flow rate of an air exhausted from the suck-back valve 800 is controlled by the second flow velocity controller 866. When an air is exhausted from the cut-off valve 700, the piston member 720 moves downwardly by a restoring force of the spring 730 and switches a flow path of the piston member 720 to a closed state. When an air is exhausted from the suck-back valve 800, the piston member 820 moves upwardly by the restoring force of the spring 830, and the diaphragm 840 of the piston member 720 moves upwardly to perform a suck-back operation of sucking the chemical.

The first flow velocity controller 766 may adjust a flow velocity of an air flowing out from the cut-off valve 700 as well as a flow velocity of an air flowing into the cut-off valve 700. The second flow velocity controller 866 may adjust a flow velocity of an air flowing out from the suck-back valve 800 as well as a flow velocity of an air flowing into the suck-back valve 800.

An air regulator 865 is installed at the second air line 861. The air regulator 865 adjusts a pressure of an air applied to the suck-back valve 800 to a set pressure. In the first embodiment, as the first air line 761 and the second air line 861 branch from the main air line 660, according to the valve assembly 900 without the air regulator 865 shown in FIG. 4, it is difficult to constantly maintain the pressure of the air applied to the suck-back valve 980. If the pressure of the air applied to the suck-back valve 800 is not adjusted within a set range, when the air applied to the suck-back valve 800 outflows from the suck-back valve 800, an air outflow speed (particularly, an initial outflow speed) depends on the restoring force of the spring 830 or is affected by other factors. The inventors of the inventive concept have recognized that for a low surface tension liquid such as an IPA, a dripping of the chemical cannot be prevented by a conventional suck-back control. The low surface tension liquid is defined as a chemical having a same or a lower surface tension of the IPA. In the case of the low surface tension liquid, the chemical attached to a nozzle wall was not completely sucked-back due to characteristics of the low surface tension liquid, and the low surface tension liquid remaining on the nozzle wall flowed down over time, and was exposed to the outside of the nozzle tip or dropped.

In addition, if the second flow velocity controller 866 is adjusted immediately after a discharge is stopped to operate a suck-back operation of the suck-back valve 800 at a minimum speed, an air in a space above 850 of the piston member 820 is discharged to an outside for a longer time. However, in this case, when a critical driving operation pressure of the spring 830 within the suck-back valve 800 is low, the air is discharged to the outside of the suck-back valve and a delay of the suck-back operation occurs until an air pressure is lower than a critical driving operation pressure, and thus the chemical is affected by a static electricity during the delay time before the suck-back operation is normally operated. An experiment on a delay of the suck-back operation is shown in Table 1 below. There was an increase of 5.5 mm for up to 10 seconds, and even at 20 seconds, a height to escape an influence of an electrostatic effect was not reached.

TABLE 1

Results of Experiment on Suck-back Motion Delay

| | Time | | | | |
|---|---|---|---|---|---|
| | 0.5 seconds | 3 seconds | 6 seconds | 10 seconds | 20 seconds |
| Increased Height of the Chemical at a Nozzle End | 0 | 1 mm | 2 mm | 4.5 mm | 15 mm |

According to the first embodiment of the inventive concept, the air regulator 865 is applied to adjust a driving pressure of the suck-back valve 800 to adjust a suck-back start time delay that may occur when the suck-back speed is minimized, thereby minimizing a risk.

The suck-back speed is set to a maximum speed of 0.5 mm/s or more and 10 mm/s or less. As a result, it is possible to ensure the stability of a suck-back of a low surface tension liquid by preventing a flow down in a pipe emptied by the suck-back of the low surface tension liquid such as an IPA and an exposure to an outside of the nozzle. A relationship between the suck-back speed and the stability of the suck-back will be described in more detail later.

Figure 6:
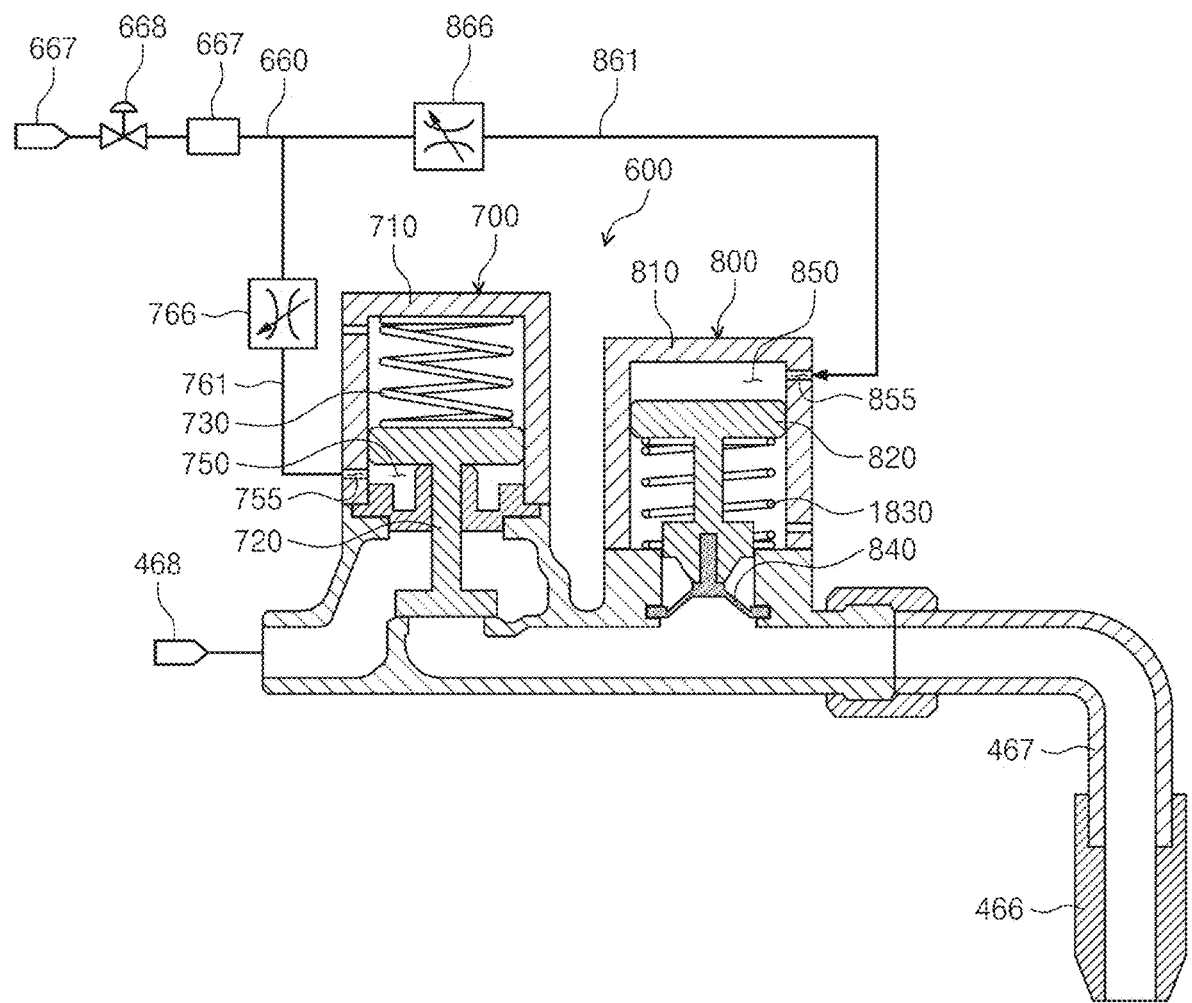
FIG. 6 is a cross-sectional view illustrating the valve assembly 600 according to a second embodiment of the inventive concept and a state in which the valve assembly is installed in the chemical flow path.

FIG. 6 is a cross-sectional view illustrating a valve assembly according to a second embodiment of the inventive concept and a state in which the valve assembly is installed at a chemical flow path. In the description of the valve assembly according to the second embodiment, a same configuration as the first embodiment is replaced by the description of the first embodiment.

According to a second embodiment of the inventive concept, a spring 1830 having a spring constant adjusted is used instead of an application of the air regulator 865. By adjusting the spring constant, it is possible to adjust so that a suck-back delay does not occur or a delay time is short enough not to affect the process. An adjusted spring constant is a value such that the suck-back delay does not occur or the delay time is short enough not to affect a process even when the suck-back speed is set to a maximum speed of 0.5 mm/s or above to 10 mm/s or less. In an embodiment, when an applied air pressure is in the same range, the spring constant of the spring 1830 of the second embodiment is higher than the spring constant of the first embodiment 830. In an embodiment, when the applied air pressure is in the same range, the spring constant of the spring 1830 is greater than the spring constant of the spring 730 of the cut-off valve 700. In an embodiment, when the applied air pressure is in the same range, the spring constant of the spring 1830 is greater than the spring constant of the spring 983 of the suck-back valve 980 applied to supply a liquid (e.g., a first liquid or a second liquid) other than a low surface tension liquid.

Figure 7:
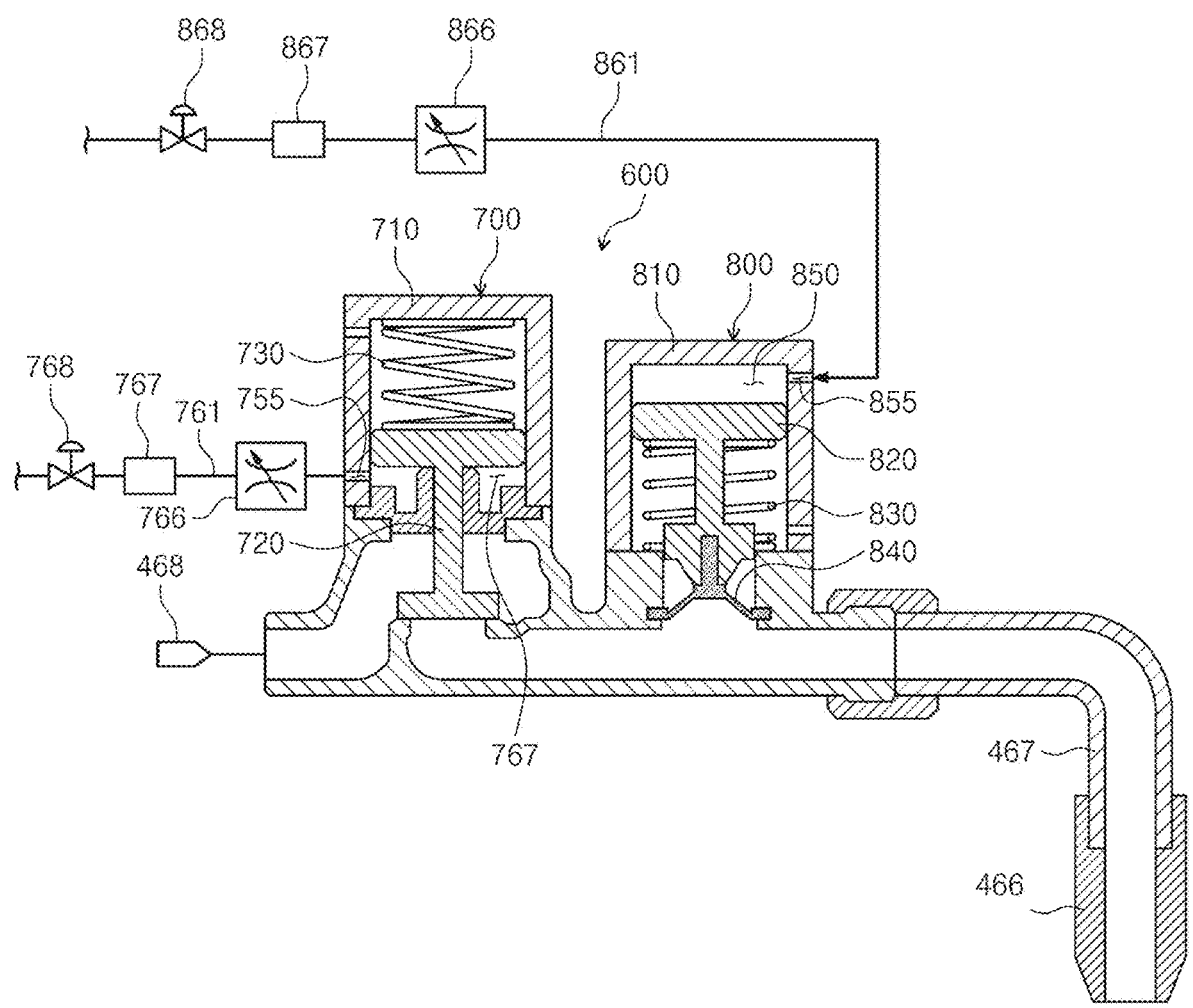
FIG. 7 is a cross-sectional view illustrating the valve assembly 600 according to a third embodiment of the inventive concept and a state in which the valve assembly is installed in the chemical flow path.

FIG. 7 is a cross-sectional view illustrating the valve assembly according to a third embodiment of the inventive concept and a state in which the valve assembly is installed at a chemical flow path. In the description of the valve assembly according to the third embodiment, a same configuration as the first embodiment is replaced by the description of the first embodiment.

As in the second embodiment, when the spring 1830 has a strong elastic force, the cut-off valve 700 and the suck-back valve 800 may simultaneously operate to affect a cut-off state. Thus, as in the third embodiment, a compressed air supply source may be separately configured by completely separating the first air line 761 for an on/off operation of the cut-off valve 700 and the second air line 861 for operating the suck-back valve 800. The first air line 761 is connected to a first compressed air supply source (not shown), and the second air line 861 is connected to a second compressed air supply source (not shown). The first air line 761 is provided with a first regulator 768 for controlling an applied air pressure, and the second air line 861 is provided with a second regulator 868 for controlling the applied air pressure. A first valve 767 for opening and closing an applied air flow is provided at the first air line 761, and a second valve 867 for opening and closing the applied air flow is provided at the second air line 861. In addition, an operation time point of the suck-back valve 800 and an operation time point of the cut-off valve 700 may be adjusted, respectively. Also, magnitudes of the air pressure supplied to the suck-back valve 800 and the cut-off valve 700 may be different, respectively. The air pressure applied to the suck-back valve 800 may be greater than the air pressure applied to the cut-off valve 700.

Meanwhile, in the first, second, and third embodiments described above, a distance from the valve assembly 600 to the nozzle 466 may be minimized within 350 mm. For example, the valve assembly 600 is located at the nozzle arm 461. Accordingly, it is possible to minimize an effect of a water hammer at an end of a discharge and reduce the amount of a stagnant chemical.

Figure 8:
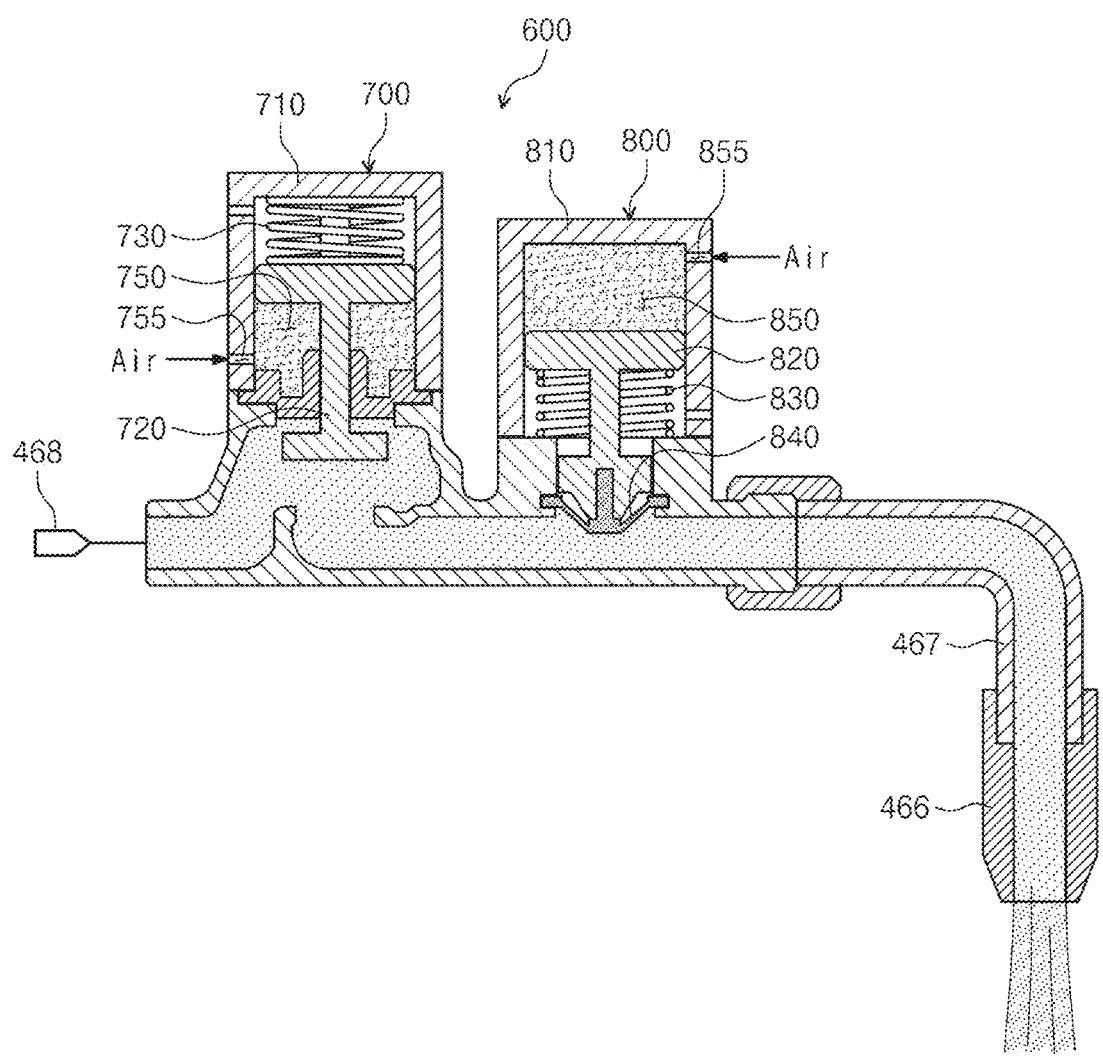
FIG. 8 is a cross-sectional view illustrating a state according to an embodiment of the inventive concept in which a chemical is discharged to a nozzle through the valve assembly while a cut-off valve of the valve assembly is opened and a suck-back valve of the valve assembly is closed.
Figure 9:
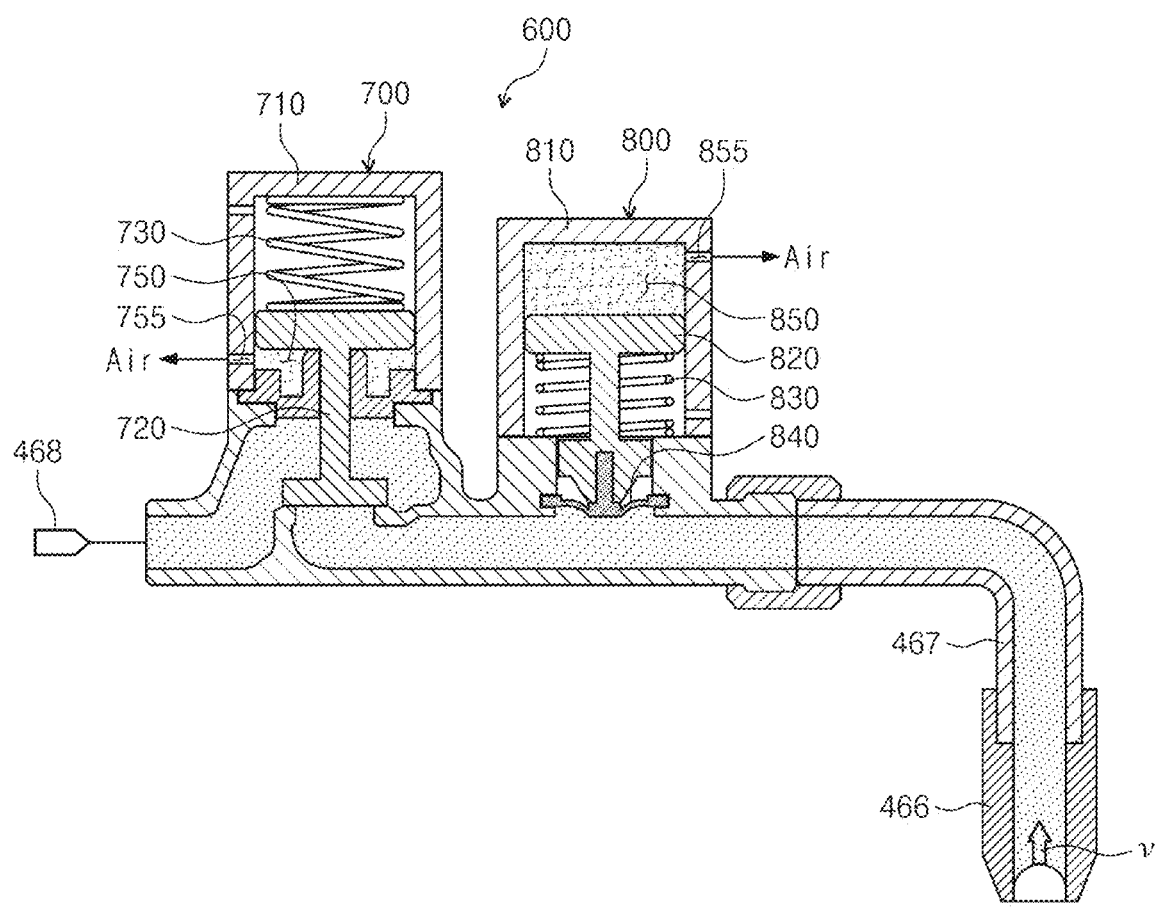
FIG. 9 is a cross-sectional view illustrating a state according to an embodiment of the inventive concept in which the cut-off valve of the valve assembly is closed and the suck-back valve of the valve assembly is opened.
Figure 10:
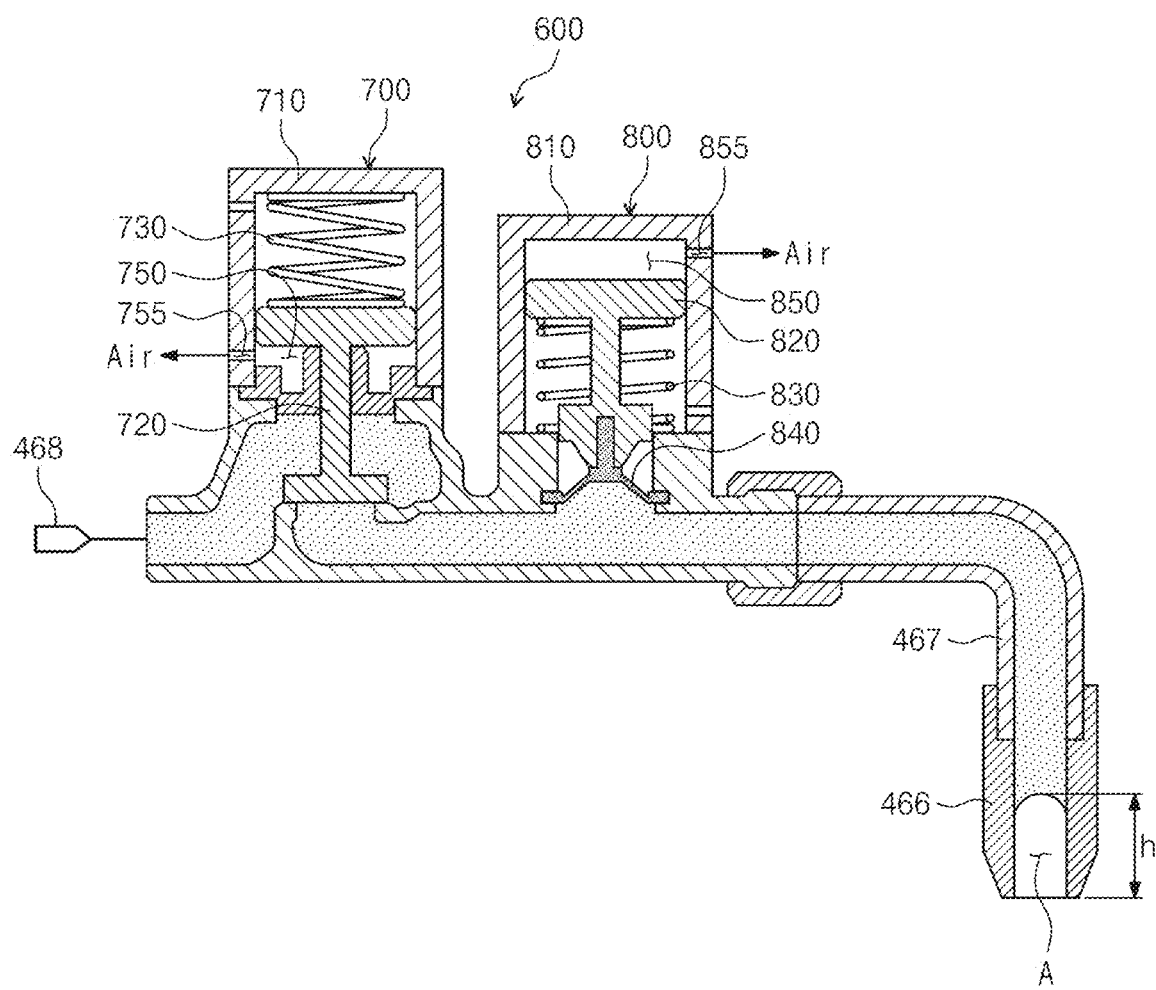
FIG. 10 is a cross-sectional view illustrating a state according to an embodiment of the inventive concept in which the cut-off valve of the valve assembly is closed and the suck-back valve of the valve assembly is opened.

FIG. 8 is a cross-sectional view illustrating a state in which the cut-off valve of the valve assembly according to an embodiment of the inventive concept is opened and a chemical passes through the valve assembly and is discharged through the nozzle with the suck-back valve in a closed state. FIG. 9 is a cross-sectional view illustrating a state in which a cut-off valve of a valve assembly according to an embodiment of the inventive concept is closed and a suck-back valve is opened. FIG. 10 is a cross-sectional view illustrating a state in which a cut-off valve of a valve assembly according to an embodiment of the inventive concept is closed and a suck-back valve is opened. It will be described with reference to FIGS. 8 to 10 sequentially.

See FIG. 8. When an air is supplied to the cut-off valve 700, the piston member 720 moves upwardly and a flow path of the flow path pipe 467 becomes an open state. When an air is supplied to the suck-back valve 800, the piston member 820 is moved downwardly. At this time, the chemical supplied from the chemical supply source 468 passes through the flow paths of the cut-off valve 700 and the suck-back valve 800 and is discharged to the outside through the nozzle 466.

See FIG. 9. When a discharge of the chemical through the nozzle 466 is completed, a supply of an air through the main air line 660 is stopped, and an air supplied to the cut-off valve 700 and the suck-back valve 800 is discharged. A flow velocity of an air exhausted from the cut-off valve 700 may be controlled by the first flow velocity controller 766, and a flow velocity of an air exhausted from the suck-back valve 800 may be controlled by the second flow velocity controller 866. When the air is discharged from the cut-off valve 700, the piston member 720 moves downwardly by the restoring force of the spring 730 and switches a flow path of the piston member 720 to a closed state. When the air is discharged from the suck-back valve 800, the piston member 820 moves upwardly by the restoring force of the spring 830, and the diaphragm 840 of the piston member 720 moves upwardly to perform a suck-back operation of sucking-back a chemical. The chemical at the end of the nozzle 466 moves in a reverse direction through the suck-back operation. A moving speed v of the chemical is controlled such that a maximum speed is 10 mm/s or less. And it should be controlled so that there is no delay from a time of a discharge stop point to a start of the suck-back.

See FIG. 10. As a suck-back operation is completed, an end of the chemical rises by a first height h. A moving distance of the chemical may be adjusted differently according to a distance between the end of the chemical and a substrate W. The first height h, which is an increased height of the chemical, may be set to 20 mm or less. By minimizing the increased height of the chemical to minimize an emptiness of a pipe, an inflow of a contamination sauce due to a fume into the flow path may be reduced.

Figure 11:
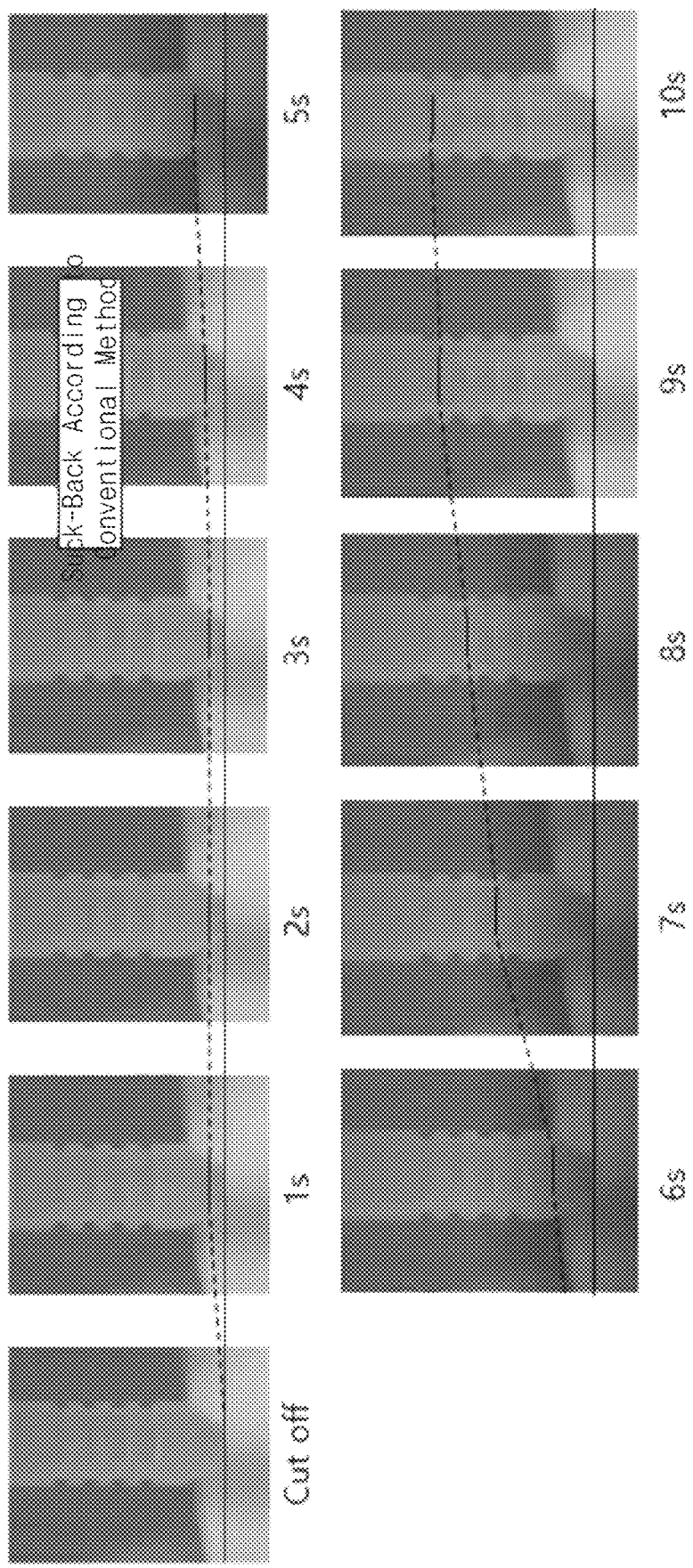
FIG. 11 is an image illustrating a movement of the chemical over time in an end of a nozzle according to a conventional method of operating the suck-back valve.

FIG. 11 is an image showing a movement of the chemical over time at a nozzle end according to a conventional method of operating the suck-back valve. It can be seen that there is a delay of about 5 seconds from a cut-off time point to a start of a suck-back, and after 5 seconds, the suck-back is quickly performed. An uncontrolled speed of the suck-back causes a residual of a low surface tension liquid, and the chemical drips down.

Figure 12:
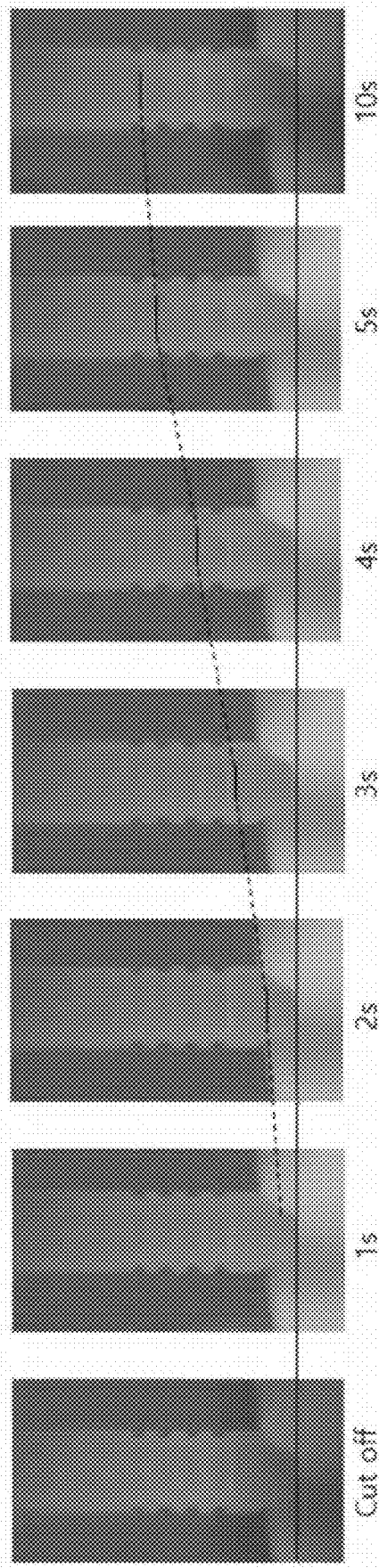
FIG. 12 is an image illustrating a movement of the chemical over time in the end of the nozzle according to an embodiment of the inventive concept of operating the suck-back valve.

FIG. 12 is an image illustrating a movement of the chemical over time in a nozzle end according to an operation of the suck-back valve according to an embodiment of the inventive concept. It may be seen that a delay does not occur from a cut-off time point to a start of a suck-back, and the suck-back is performed at a uniform speed at an entire section. A controlled speed of the suck-back allows a low surface tension liquid to be sucked-back without remaining.

As described above, according to an embodiment of the inventive concept, in the application of the low surface tension liquid, a dripping of the chemical during the suck-back may be minimized.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A liquid treating apparatus comprising:
    a spin chuck configured to support and rotate a substrate; and
    a liquid supply unit configured to supply a liquid to the substrate, and
    wherein the liquid supply unit comprises:
    a nozzle configured to discharge the liquid to the substrate;
    a flow path pipe configured to connect the nozzle and the liquid supply source;
    a valve assembly provided at the flow path pipe and configured to cut-off and suck-back a flow of the liquid within the flow path pipe
    wherein the valve assembly comprising:
        a cut-off valve configured to open and close a flow of a treating liquid within the flow path pipe; and
        a suck-back valve provided adjacent to an end of the cut-off valve and configured to suck-back the liquid of the nozzle,
        wherein the liquid treating apparatus further comprising: a first flow velocity controller configured to adjust a flow velocity of an air introduced into or outflowed from the cut-off valve; and
        a second flow velocity controller configured to adjust a flow velocity of an air introduced into or outflowed from the suck-back valve, and
        wherein the second flow velocity controller controls a suck-back moving speed of the liquid to be 10 mm/s or lower.

2. The liquid treating apparatus of claim 1 further comprises an air regulator for adjusting an air pressure applied to the suck-back valve to a first pressure or below, and
    wherein the first pressure which is an air pressure applied to the suck-back valve is different from a second pressure applied to the cut-off valve.

3. The liquid treating apparatus of claim 2, wherein the first air pressure is lower than
    the second air pressure.

4. The liquid treating apparatus of claim 2, further comprises:
    a main air line connected to a pressurized air supply source;
    a first air line branching from the main air line and connected to the suck-valve; and
    a second air line branching from the main air line and connected to the cut-off valve, and
    wherein the air regulator and a first flow velocity regulator are provided at the first air line, and
    a second flow velocity regulator is provided at the second air line.

5. The liquid treating apparatus of claim 1, further comprise:
    a first air line, wherein an end of the first air line is connected to a first open/close valve configured to control an open/close of an introduction of a pressurized air adjusted to the first pressure, and the other end of the first air line is connected to the suck-back valve and configured to supply a pressurized air to the suck-back valve; and
    a second air line, an end of the second air line is connected to a second open/close valve configured to control an open/close of an introduction of a pressurized air adjusted to the second pressure which is different from the first pressure, the other end of the second air line is connected to the cut-off valve, and wherein the second air line configured to supply a pressurized air to the cut-off valve.

6. The liquid treating apparatus of claim 5, wherein the first pressure is lower than the second pressure.

7. The liquid treating apparatus of claim 1, wherein a first spring constant which is a spring constant of a spring provided at the suck-back valve is higher than a second spring constant which is a spring constant of a spring provided at the cut-off valve.

8. The liquid treating apparatus of claim 1, wherein the valve assembly is installed within 350 mm from the nozzle with respect to the flow path pipe connected to the nozzle and the valve assembly.

9. The liquid treating apparatus of claim 1, wherein the liquid supply unit comprises an arm, and wherein the nozzle is provided coupled to an end of the arm, and
the valve assembly is provided at the arm.

10. The liquid treating apparatus of claim 1, wherein a height of which the liquid rises from an end of the nozzle by being sucked-back by the suck-back valve is 20 mm or lower.

11. The liquid treating apparatus of claim 1, wherein the liquid is an organic solvent.

12. The liquid treating apparatus of claim 11, wherein the organic solvent is an IPA.

13. A liquid treating apparatus comprising:
a spin chuck configured to support and rotate a substrate; and
a liquid supply unit configured to supply a liquid to the substrate, and
wherein the liquid supply unit comprises:
a first nozzle connected to a first flow path pipe and configured to discharge a first liquid to the substrate;
a first valve assembly including a first cut-off valve for cutting-off a flow of the first liquid within the first flow path pipe and a first suck-back valve for sucking-back the first liquid, and installed at the first flow pipe;
a second nozzle connected to a second flow path pipe and configured to discharge a second liquid to the substrate;
a second valve assembly including a second cut-off valve for cutting-off a flow of the second liquid within the second flow path pipe and a second suck-back valve for sucking-back the second liquid, and installed at the second flow pipe path;
a first flow velocity controller configured to adjust an air flow velocity of an air introduced into or outflowed from the first suck-back valve; and
a second flow velocity controller configured to adjust an air flow velocity of an air introduced into or outflowed from the second suck-back valve, and
wherein a first speed of a suck-back speed provided by the first valve assembly is slower than a second suck-back speed provided by the second valve assembly, and
a surface tension of the first liquid is lower than a surface tension of the second liquid.

14. The liquid treating apparatus of claim 13, wherein a speed of an air outflowed from the first suck-back valve is set slower than a speed of an air outflowed from the second suck-back valve at the first speed controller and the second speed controller.

15. The liquid treating apparatus of claim 13, wherein the first speed is 10 m/s or lower.

16. The liquid treating apparatus of claim 13, wherein a first air pressure which is an air pressure applied to operate the first suck-back valve is lower than a second air pressure which is an air pressure applied to operate the second suck-back valve.

17. The liquid treating apparatus of claim 13, wherein a first spring constant which is a spring constant of a spring provided at the first suck-back valve is higher than a second spring constant which is a spring constant of a spring provided at the second suck-back valve.

18. The liquid treating apparatus of claim 13, wherein the first valve assembly is installed within 350 mm from the nozzle with respect to the flow path pipe connected to the first nozzle and the first valve assembly.

19. The liquid treating apparatus of claim 13, wherein the liquid supply unit comprises at least one arm, and wherein the first nozzle is provided coupled to one end of an arm, and
the first valve assembly is provided at the arm couped to the first nozzle.

20. The liquid treating apparatus of claim 13, wherein a height of which the first liquid rises from an end of the nozzle due to being sucked-back by the first suck-back valve is 20 mm or lower.

* * * * *